United States Patent
Lindrud et al.

(10) Patent No.: US 6,302,958 B1
(45) Date of Patent: Oct. 16, 2001

(54) SONIC IMPINGING JET CRYSTALLIZATION APPARATUS AND PROCESS

(75) Inventors: Mark D. Lindrud, Basking Ridge; Soojin Kim, West Orange; Chenkou Wei, Princeton Junction, all of NJ (US)

(73) Assignee: Bristol-Myers Squibb Company, Princeton, NJ (US)

( * ) Notice: Subject to any disclaimer, the term of this patent is extended or adjusted under 35 U.S.C. 154(b) by 0 days.

(21) Appl. No.: 09/492,483

(22) Filed: Jan. 27, 2000

Related U.S. Application Data
(60) Provisional application No. 60/117,878, filed on Jan. 29, 1999.

(51) Int. Cl.[7] ................................................. C30B 7/14
(52) U.S. Cl. ..................... 117/65; 422/245.1; 23/295.1; 23/300
(58) Field of Search .............. 422/245.1; 23/295 R, 23/300; 117/65, 925

(56) References Cited

U.S. PATENT DOCUMENTS

| | | | |
|---|---|---|---|
| 2,751,335 | 6/1956 | Carver et al. | 196/147 |
| 2,876,083 | 3/1959 | Prietl | 23/295 |
| 4,045,454 | * 8/1977 | Yamada et al. | 260/369 |
| 4,567,912 | 2/1986 | Levine | 137/606 |
| 4,663,433 | 5/1987 | Pyles et al. | 528/496 |
| 5,074,671 | 12/1991 | Roueche et al. | 366/172 |
| 5,314,506 | 5/1994 | Midler, Jr. et al. | 23/295 R |
| 5,578,279 | 11/1996 | Dauer et al. | 422/245.1 |
| 5,767,068 | * 6/1998 | VanDevanter et al. | 514/9 |
| 5,798,810 | * 8/1998 | Tanioka et al. | 349/123 |

FOREIGN PATENT DOCUMENTS

| | | | |
|---|---|---|---|
| 671 166-A5 | 8/1989 | (CH) | B01D/9/02 |
| 275 607-A1 | 7/1988 | (EP) | B02C/19/18 |
| 737009 | * 5/1980 | (RU) . | |

OTHER PUBLICATIONS

Liu, P. et al, "The use of Continuously Impinging Jets to Control Crystallization and Particle Size in Pharmaceutical Manufacturing" presented at the American Institute of Chemical Engineers' National Meeting on Nov. 1990 in Chicago, Illinois, English abstract.

Pohorecki et al., Chemical Engineering Science, 38 (1), pp. 79–83 (1983).

Mahajan et al., AIChE Journal, 42 (7), pp. 1801–1814 (1996).

* cited by examiner

Primary Examiner—Robert Kunemund
(74) Attorney, Agent, or Firm—Shah R. Makujina

(57) ABSTRACT

A novel apparatus and process for crystallizing submicron-sized crystals of a pharmaceutical composition. The submicron-sized crystals, which have an average size of less than 1 micron, provide high surface area end product crystals with greatly improved stability and purity, and which afford crystals having improved bioavailability, higher dissolution, decreased decomposition rate and longer shelf-life.

17 Claims, 2 Drawing Sheets

SONIC IMPINGING JET CRYSTALLIZATION APPARATUS AND PROCESS

RELATED APPLICATIONS

This application claims priority benefit under Title 35 § 119(e) of U.S. Provisional Application No. 60/117,878, filed Jan. 29, 1999, and entitled SONIC IMPINGING JET CRYSTALLIZATION APPARATUS AND PROCESS, the entire contents of which are incorporated herein by reference.

FIELD OF THE INVENTION

The present invention is directed to a crystallization apparatus and process for producing submicron-sized particles.

BACKGROUND OF THE INVENTION

Producing uniform, very small particles is a common processing challenge for pharmaceutical substances. In general, smaller particles provide two very desirable qualities of pharmaceuticals, namely higher bioavailability and a higher dissolution rate. In U.S. Pat. No. 5,314,506 there is described a method using two impinging jets to achieve uniform particles. However, the particles formed using the process in U.S. Pat. No. 5,314,506 are only as small as 3 microns in size and the majority of the crystals formed are in the range of 3–20 microns.

The general process by which these prior art small particles are produced involves two impinging liquid jets positioned within a well stirred flask to achieve high intensity micromixing. At the point where the two jets strike one another a very high level of supersaturation exists. As a result of this high supersaturation, crystallization occurs extremely rapidly within the small mixing volume at the impingement point of the two liquids. Since new crystals are constantly nucleating at the impingement point, a very large number of crystals are produced. As a result of the large number of crystals formed, the average size remains small, although not all the crystals formed are small in size.

The novel apparatus and process of this invention utilizes impinging jets to achieve high intensity micromixing in the crystallization process. The background of high intensity micromixing is discussed in detail in U.S. Pat. No. 5,314,506, which is incorporated by reference herein.

SUMMARY OF THE INVENTION

The present invention pertains to a novel apparatus and process for crystallizing submicron-sized particles, having an average size of less than 1 micron, and which provides high surface area end product crystals with greatly improved stability and purity. The pure, high surface area particles produced by the process of the present invention display superior crystal structure when compared with particles formed by standard slow crystallization plus milling methods known in the art which use the same quality and kind of feed compounds. These improvements in crystal structure result in decreases in decomposition rate and therefore longer shelf-life for the crystallized product or pharmaceutical composition. Moreover, the smaller size of the pharmaceutical crystals formed using the apparatus of the present invention provide for crystals having a higher bioavailability and higher dissolution rate.

More specifically, the novel apparatus and process of this invention relate to the addition of a sonication probe along with impinging jets to achieve high intensity micromixing of fluids so as to form a homogeneous composition prior to the start of nucleation in a continuous crystallization process.

The novel apparatus and process of the present invention provide for direct crystallization of high surface area submicron sized particles of high purity and stability.

DETAILED DESCRIPTION OF THE INVENTION

The novel process of the present invention involves the positioning of a sonication probe or sonicator in a flask wherein liquid jets are positioned to create impinging fluid jet streams to achieve high intensity micromixing of fluids prior to nucleation in a crystallization process. Two or more jets may be used to micromix two or more fluids, although it is preferable to use two jets to micromix the fluids. One liquid jet is generally a solvent saturated with product, and the other liquid jet generally contains an anti-solvent. Maximum micromixing is effected when the two impinging jets are positioned substantially diametrically opposite one another, i.e., at or close to 180° from one another, and advantageously located a distance of 0.4" apart from each other.

Figure 1:
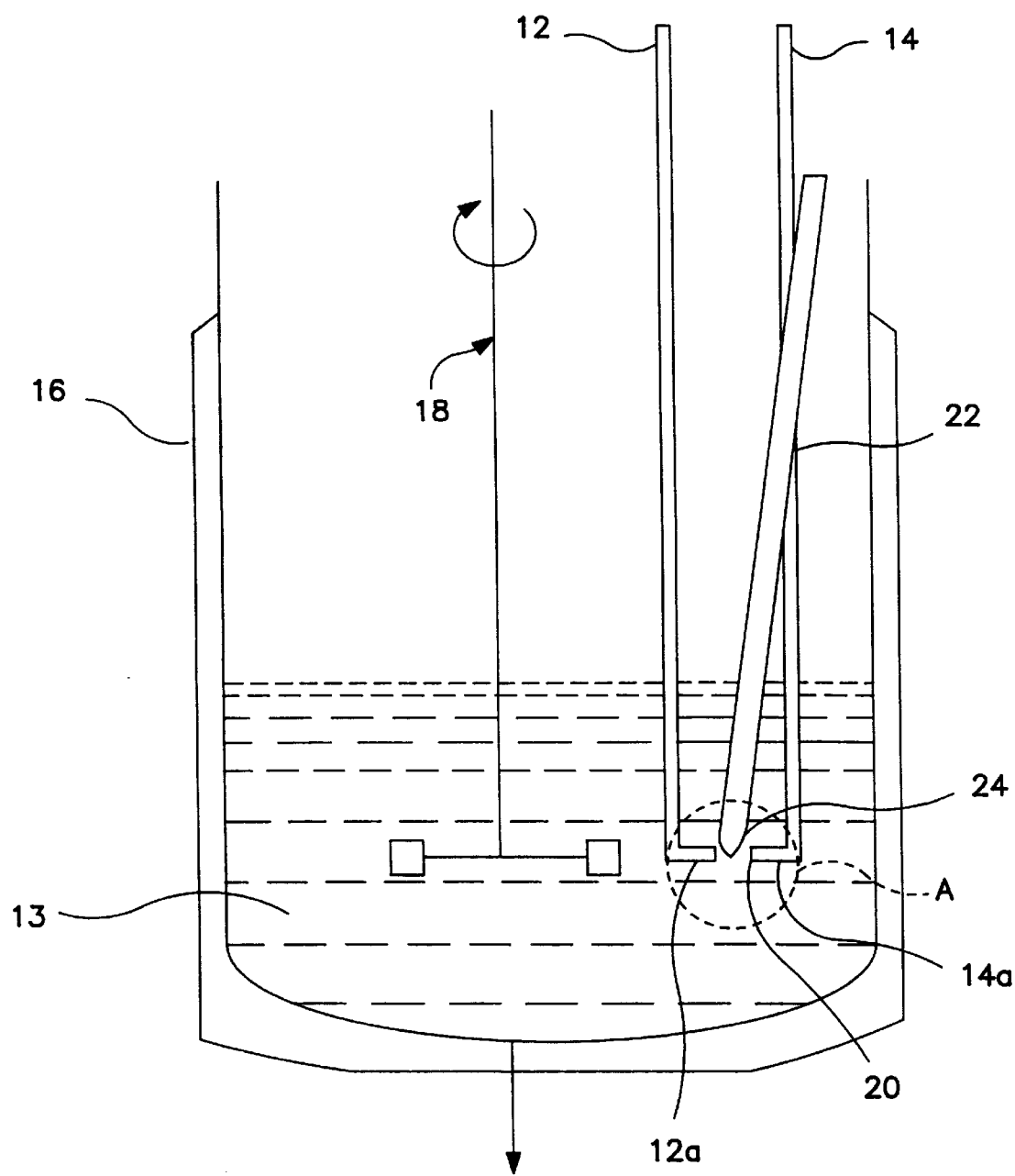
FIG. 1 is a schematic diagram showing a crystal production system according to the present invention depicting two impinging jets 12, 14, an agitator 18, and a sonication probe 22 positioned in a flask 16.

As illustrated in FIG. 1, the impinging jet apparatus comprises a first jet 12 and a second jet 14 arranged substantially diametrically opposite one another in a flask 16, preferably a 1000 ml flask, which is agitated by a overhead stirrer 18. Flask 16 contains bulk or liquid 13, which is advantageously the same material as that coming through second jet 14 (anti-solvent). First jet 12 and second jet 14 are provided with jet orifices 12a and 14a respectively, which are positioned substantially 180° from each other at a distance of 0.4" from one another. As illustrated in FIG. 1 and more clearly in FIG. 2, the space 20 defined between first and second jet orifices 12a and 14a defines an impingement point where the fluid from first jet 12 and the fluid from second jet 14 impinge and micromix within flask 16.

The liquids which are pumped through first and second jets 12, 14 may be of different solvent composition. One fluid may be a solution of the pharmaceutical compound to be crystallized or a combination of solvents (generally referred to as "feed solution") and the other fluid may be a solvent or combination of solvents capable of initiating the compound's precipitation from solution (generally referred to as "anti-solvent"), chosen for its relatively low solvation property with respect to that compound. Such solvents and anti-solvents may include but are not limited to water, methanol, ethanol, DMSO (dimethyl sulfoxide), IPA (isoproplyl alcohol), DMF (dimethylformamide) or acetone.

Alternatively, the two fluids used in the process of the present invention may both be solution of the pharmaceutical compound to be crystallized in the same suitable solvent or combination of solvents but each at a different temperature, and nucleation/precipitation can be initiated by instantaneous temperature reduction. A small amount of a suitable surfactant may be added to the fluids used in the process in order to alleviate agglomeration which might occur during the micromixing crystallization process. Suitable surfactants which may be used include, but are not limited, to Tween 80, Cremophor A25, Cremophor EL, Pluronic F68, Pluronic F127, Brij 78, Klucel, Plasdone K90, Methocel E5, and PEG (mw 20,000) and the like.

Figure 2:
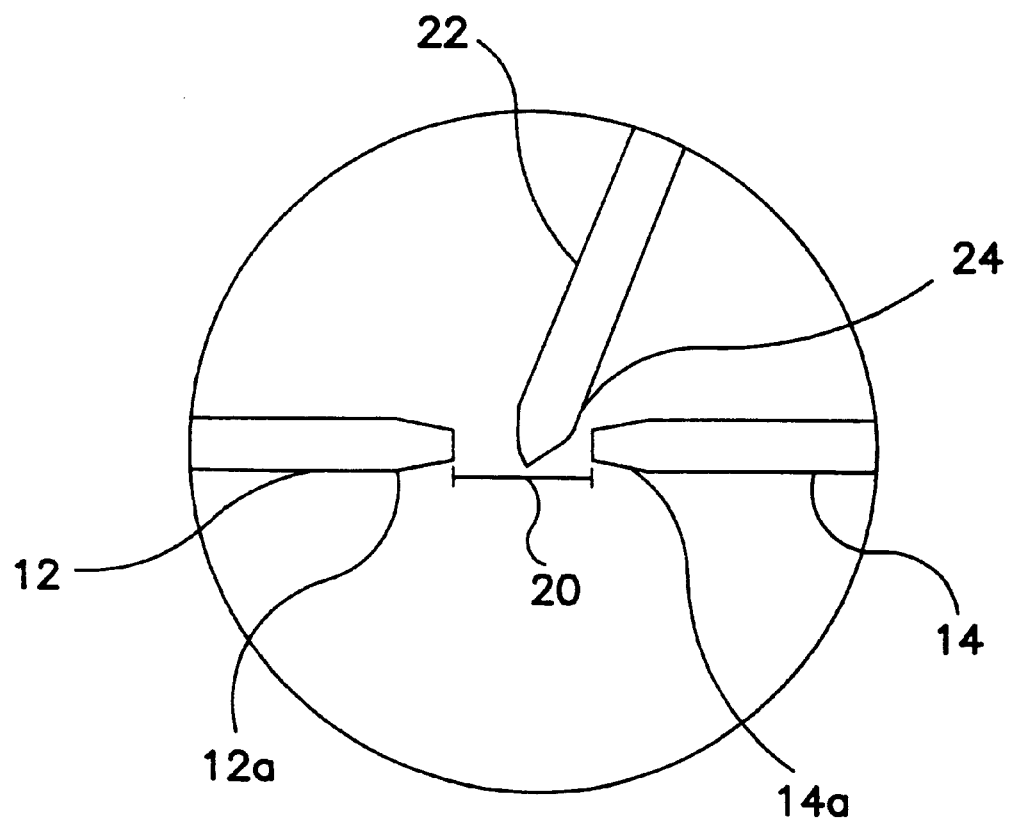
FIG. 2 is an enlarged sectional view of the region denoted by A in FIG. 1, illustrating the substantially diametrically opposite positioning of the impinging jet tips and the position of the sonicator probe tip within the same plane of the impinging jet tips.

A sonication probe or sonicator 22, preferably a 20 khz sonication probe, having a probe tip 24 on one end, is positioned in flask 16. Advantageously, probe tip 24 of a sonication probe 22 is immersed in the crystallization slurry throughout the crystallization process. For maximum effectiveness, probe tip 24 of sonicator 22 is advantageously located as close as possible to the impinging point 20, as illustrated in FIG. 2. Depending on several processing parameter, such as temperature, liquid viscosity and percent solids, among others, probe 24 may provide up to 500 watts of power within the crystallization slurry. The addition of ultrasonic energy in the immediate vicinity of the impinging jets 12, 14 produces an average particle size of less than 1 micron.

In accordance with the present invention, liquid is pumped through first and second jets 12, 14 at a minimum linear velocity of 12 m/s. The liquid is comprised of one or more solvents which may include a combination of the pharmaceutical compound and a solvent and an anti-solvent, or simply a combination of solvents and an anti-solvent. When the two jet streams emerge and meet midway between orifice tips 12a, 14a high intensity micromixing occurs and a disk of crystallization slurry is formed. Depending upon the solvents and pharmaceutical compound(s) being used, each jet stream is advantageously independently maintained at a temperature in the range of 0° to 100° C. To ensure good mixing in the bulk 13, an agitation rate of >300 RPM is maintained throughout the crystallization procedure using a mixer or agitator 18, such as a Rushton turbine or other high shear impeller, although the invention is not limited in the type of mixer or agitator used. As illustrated in FIG. 1, agitator 18 is positioned within flask 16 with first and second jets 12, 14 and sonicator 22. Agitator 18 is advantageously positioned proximate first and second jet 12, 14, but should not interfere with the micromixing at impingement point 20.

Proper placement of probe tip 24 of sonicator 22 within impinging point 22 is essential. A comparison of two probe tip 24 placements has demonstrated that locating probe tip 24 lower than the jet orifices 12a, 14a, and hence outside of impinging point 20, yields slightly larger crystals than if probe tip 24 is located at the same level with jet orifices 12a, 14, and hence within impingement point 20. For example, in Experiments 44032-006-12 and 44032-006-18, referenced hereinbelow in the Examples, probe tip 24 was positioned approximately one inch below the level of jet orifices 12a, 14a. The resulting crystals from these batches had average sizes of 0.5164 and 0.5178 microns with 97.499% and 97.092% respectively, of the crystals less than 0.500 microns. In contrast, in Experiment 44032-006-27, wherein probe tip 24 was positioned at the same level as jet orifices 12a, 14a and within impingement point 20, crystals were formed having an average diameter of 0.5129 microns, with 99.987% less than 0.5000 microns.

Regardless of the number of jets used, the jet orifices should be positioned so that the emitted fluid streams will impinge with a high intensity. Impingement of the fluids is essential so that immediate high turbulence impact is created. Thus it is crucial that when two jets are used, they must be positioned such that their orifices are substantially diametrically opposite each other to facilitate proper fluid impingement.

The following examples are provided for the purpose of illustrating the present invention and should not be construed as being a limitation on the scope or spirit of the instant invention. It should be understood that there may be other embodiments which fall within the spirit and scope of the invention as defined by the claims appended hereto.

EXAMPLE 1

Crystallization of (Z-3-[1-(4-chorophenyl)-1-(4-methylsulfonylpenyl)methylene]-dihydrofuran-2-one Experiment No. 42216-195

(1) 152.5 grams of the pharmaceutical compound were dissolved in 300 ml of DMSO at 65–75° C. 1200 ml of water (RO quality, filtered) was chilled at 2° C. The rich solution and water were both charged to agitated, jacketed vessels. The respective temperatures of the contents were maintained by heating or chilling the jackets. The process fluids were circulated through the feedlines to attain steady state temperatures and flow rates.

(2) 300 ml of water (RO quality, filtered) was charged to the impinging vessel. The jacket temperature was maintained at 2° C. throughout the crystallization.

(3) With the mechanical stirrer and sonication power at maximum level, the solution and water jets were impinged at a 1:4 mass flow rate. The rich solution's flowrate was 0.18 kg/min through a 0.020" nozzle and the water flowrate was 0.72 kg/min through a 0.040" nozzle.

(4) Upon completion of crystallization, the product was filtered and then washed with approximately 100 ml water (RO quality, filtered). The filter cake was dried in vacuo at 70° C. until dry. Yield is 89.4% excluding 24.19 grams recovered from the solution vessel and circulating lines.

(5) The dry product was delumped by passing it through an 80 mesh screen. API aerosizer assays yield a mean particle size of 0.54 microns with 95% of particles under 0.94 microns.

Summary of Experiments with BMS-225969

| Experiment No. | Mean Size | % <0.5000 µm | 95th percentile |
|---|---|---|---|
| 42216-157-20 | 0.5090 microns | 99.011 | 0.5086 microns |
| 42216-158 | 0.5124 | 98.097 | 0.5087 |
| 42216-195 | 0.5376 | 92.224 | 0.9373 |
| 44032-006-12 | 0.5164 | 97.499 | 0.5087 |
| 44032-006-18 | 0.5178 | 97.092 | 0.5088 |
| 44032-006-27 | 0.5129 | 97.987 | 0.5087 |

EXAMPLE 2

Crystallization of [R-(R*,R*)]-4-[2-[2,4-Difluorophenyl)-2-hydroxy-1-methyl-3-(1H-1,2,4-triazol-1-yl)propyl-4-thiazolyl]benzonitrile Experiment No. 42216-027

(1) 50 grams of the pharmaceutical compound were dissolved in 150 ml of DMSO at 70° C. and the solution was polish filtered. 1000 ml of water (RO quality, filtered) was tempered to 20° C. The rich solution and water were both charged to agitated, jacketed vessels. The respective temperatures of the contents were maintained by heating or chilling the jackets. The process fluids were circulated through the feed lines to attain steady state temperatures and flow rates.

(2) 300 ml of water (RO quality, filtered) was charged through the impinging vessel. The jacket temperature was maintained at 20° C. throughout the crystallization.

(3) With the mechanical stirrer and sonication power at maximum level, the solution and water jets were impinged at a 1:4 mass flow rate. The solution's flow rate is 0.18 kg/min though a 0.020" nozzle and the water flowrate is 0.72 kg/min through a 0.040" nozzle.

(4) Upon completion of crystallization, the product was filtered and washed with 2 liters of water (RO quality, filtered). The filter cake was dried in vacuo at 70° C. until dry.

(5) The dry product was delumped by passing it through an 80 mesh screen. API aerosizer assays yield a mean particle size of 0.5324 microns with 95% of particles under 0.8321 microns.

| Experiment No. | Mean Size | % <0.5000 μm | 95th percentile |
| --- | --- | --- | --- |
| 42216-028-10 | 0.5324 microns | 91.563 | 0.8321 microns |

What is claimed is:

1. A process for the crystallization of a pharmaceutical compound comprising positioning a tip of a sonication probe within a gap defined between two or more fluid jets positioned such that fluid jet streams which emerge from said fluid jets impinge in said gap creating a point of high turbulence at the point of impact of said fluid streams, each of said fluid streams having sufficient linear velocity to achieve high intensity micromixing of the solutions prior to nucleation, said sonication probe providing ultrasonic energy in the immediate vicinity of said impinging fluid streams so as to effect nucleation and the direct production of small crystals, at least 95% of said crystals having a diameter of less than 1 micron.

2. The process according to claim 1, wherein two fluid jets are used, said first fluid jet is provided for carrying a first fluid stream, said first fluid stream comprising a combination of DMSO and said pharmaceutical compound, said second fluid jet is provided for carrying a second fluid stream, said second fluid stream comprising water.

3. The process according to claim 2, wherein said first and said second fluid jets are substantially diametrically opposed to each other, such that said first and second fluid streams impinge so as to attain high intensity impact.

4. The process according to claim 1, wherein at least one of said fluid streams comprises a surfactant.

5. The process according to claim 1, wherein said pharmaceutical compound selected from (Z-3-[1-(4-chorophenyl)-1-(4-methylsulfonylpenyl)methylene]-dihydrofuran-2-one, and [R-(R*,R*)]4-[2-[2,4-Difluorophenyl)-2-hydroxy-1-methyl-3-(1H-1,2,4-triazol-1-yl)propyl4-thiazolyl]benzonitrile.

6. The process according to claim 1, wherein each jet stream is independently at a temperature in the range of about 0° C. to 100° C.

7. The process according to claim 1, wherein substantially all of said crystals have a diameter equal to or less than 1 micron.

8. The process according to claim 1, wherein said gap defined between said fluid jets is 0.4 inches.

9. The process according to claim 1, wherein said tip of said sonication probe is positioned in said gap in the same plane with said fluid jets and at the point where said fluid streams from set fluid jets impinge with one another.

10. The process according to claim 9, wherein said sonication probe provides power in a range of between 30 and 150 watts.

11. A crystallization apparatus for producing submicron-sized particles, which comprises:

a crystallization flask;

two or more fluid impinging jets, an agitator, and a sonication probe having a probe tip, wherein said impinging jets, said agitator and said sonication probe are positioned within said crystallization flask, said impinging jets positioned substantially diametrically opposed to each other, and said sonication probe positioned proximate said impinging jets such that said probe tip is positioned such that it is at the same level as the impinging jets.

12. The crystallization apparatus according to claim 11, wherein said apparatus comprises two fluid impinging jets, said first fluid jet is provided for carrying a first fluid stream, said first fluid stream comprising a combination of DMSO and a pharmaceutical compound, said second fluid jet is provided for carrying a second fluid stream, said second fluid stream comprising water.

13. The crystallization apparatus according to claim 12, wherein said first and said second fluid jets are substantially diametrically opposed to each other, such that said first and second fluid streams impinge so as to attain high intensity impact.

14. The crystallization apparatus according to claim 11, wherein said agitator provides an agitation rate of >300 rpm which is maintained throughout the crystallization process.

15. The crystallization apparatus according to claim 11, wherein sonication probe is a 20 khz probe.

16. The crystallization apparatus according to claim 15, wherein said sonication probe provides power to said first and said second fluid streams within said flask in the range from 30 to 50 watts.

17. The process according to claim 1, wherein said pharmaceutical compound is Z-3-[1-(4-chlorophenyl)-1-(4-methylsulfonylphenyl)methylene]-dihydrofuran-2-one or [R-R*,R*)]-4-[2-(2,4-difluorophenyl)-2-hydroxy-1-methyl-3-(1H-1,2,4-triazol-1-yl)propyl-4-thiazolyl]benzonitrile.

* * * * *